US010373562B2

(12) United States Patent
Zhang et al.

(10) Patent No.: US 10,373,562 B2
(45) Date of Patent: Aug. 6, 2019

(54) GATE DRIVING CIRCUIT, UNIT THEREOF, AND DISPLAY DEVICE

(71) Applicant: Peking University Shenzhen Graduate School, Guangdong (CN)

(72) Inventors: Shengdong Zhang, Guangdong (CN); Chuanli Leng, Guangdong (CN); Zhijin Hu, Guangdong (CN); Congwei Liao, Guangdong (CN)

(73) Assignee: Peking University Shenzhen Graduate School, Guangdong (CN)

( * ) Notice: Subject to any disclaimer, the term of this patent is extended or adjusted under 35 U.S.C. 154(b) by 165 days.

(21) Appl. No.: 15/568,992

(22) PCT Filed: Mar. 25, 2016

(86) PCT No.: PCT/CN2016/077394
§ 371 (c)(1),
(2) Date: Oct. 24, 2017

(87) PCT Pub. No.: WO2016/169389
PCT Pub. Date: Oct. 27, 2016

(65) Prior Publication Data
US 2018/0130415 A1     May 10, 2018

(30) Foreign Application Priority Data

Apr. 24, 2015  (CN) .......................... 2015 1 0201301

(51) Int. Cl.
*G11C 19/00*     (2006.01)
*G09G 3/3258*    (2016.01)
(Continued)

(52) U.S. Cl.
CPC ............ *G09G 3/3258* (2013.01); *G09G 3/20* (2013.01); *G09G 3/3696* (2013.01); *G11C 19/28* (2013.01);
(Continued)

(58) Field of Classification Search
None
See application file for complete search history.

(56) References Cited

U.S. PATENT DOCUMENTS

| 2013/0169319 A1* | 7/2013 | Sasaki | G09G 3/3677 327/108 |
| 2014/0091997 A1* | 4/2014 | Han | G09G 3/3677 345/92 |

(Continued)

FOREIGN PATENT DOCUMENTS

CN    104318883 A    1/2015

OTHER PUBLICATIONS

PCT Search Report and Written Opinion dated Jul. 4, 2016, International Application No. PCT/CN2016/077394, filed Mar. 25, 2016; 6 pages.

(Continued)

*Primary Examiner* — Tuan T Lam
(74) *Attorney, Agent, or Firm* — Lee & Hayes, P.C.

(57) ABSTRACT

The present application provides a gate driver circuit comprising at least one cascaded gate driver circuit unit. The low-level-holding enabling terminal of the gate driver circuit unit is connected to an adaptive voltage generating module. The adaptive voltage generating module generates a self-compensating voltage according to its constant current source and transmits to the low-level-holding enabling terminal, so as to provide an effective voltage level to the low-level-holding enabling terminal. Because the threshold voltage shift caused by pulling-down transistors in the low-level-holding module is embodied at the low-level-holding enabling terminal, the adaptive voltage generating module generates a self-compensating voltage with its constant current source according to the threshold voltage to compensate the increase of the threshold voltage. As such, the overdrive voltage of the pulling-down the transistors (Continued)

keep constant which provides good pulling-down performance, and consequently the lifetime of the gate driver circuit is prolonged.

10 Claims, 4 Drawing Sheets

(51) Int. Cl.
*G09G 3/20* (2006.01)
*G09G 3/36* (2006.01)
*G11C 19/28* (2006.01)

(52) U.S. Cl.
CPC ... *G09G 3/3677* (2013.01); *G09G 2310/0267* (2013.01); *G09G 2310/0286* (2013.01)

(56) References Cited

U.S. PATENT DOCUMENTS

| | | | |
|---|---|---|---|
| 2016/0171915 A1* | 6/2016 | Lee | G09G 3/20 345/211 |
| 2017/0032752 A1* | 2/2017 | Huang | G09G 3/3648 |
| 2017/0061913 A1* | 3/2017 | Wang | G11C 19/28 |
| 2017/0097650 A1* | 4/2017 | Zhang | G09G 3/20 |
| 2017/0213500 A1* | 7/2017 | Zhang | G09G 3/36 |
| 2018/0061347 A1* | 3/2018 | Zhang | G09G 3/3677 |

OTHER PUBLICATIONS

CN Office Action dated Dec. 26, 2016, CN Application No. 201510201301.5.

\* cited by examiner ial Application No. PCT/CN2016/077394, filed Mar. 25, 2016, entitled GATE DRIVING CIRCUIT, UNIT THEREOF, AND DISPLAY DEVICE, which claims the benefit of China Patent Application No. CN201510201301.5, filed Apr. 24, 2015, entitled GATE DRIVING CIRCUIT, UNIT THEREOF, AND DISPLAY DEVICE, which are incorporated herein by reference.

TECHNICAL FIELD

Aspects of the present disclosure relate generally to the electronic circuit field, and more particularly, to a gate driver circuit, a unit thereof, and a display device.

BACKGROUND

The thin film transistor (TFT) flat panel display (FPD) is the main stream in contemporary display technologies. Large size and higher resolution are important development directions of TFT-FPD. TFT-integrated gate driver circuit (Gate Driver On Array, GOA) is an important technology generated during the development of large size and high resolution TFT-FPD. Compared with the traditional way of external gate driver IC, the number of external wires in the TFT-FPD adopting GOA is greatly reduced, so the constraint on resolution due to concentrated wires is released. Other advantages brought by the GOA technology comprise reducing the number of external IC which renders more reliable signal transmission, and reducing the cost of display module which renders thinner display panels with narrower border and better looking.

In a GOA circuit, the gate scanning signal output by it is at low voltage level for most of the working time, so a low-level-holding circuit is needed to hold the intermediate node and the signal output terminal at low voltage level, to avoid the clock feed-through effect or current leakage and so forth which would affect the voltage of the GOA's intermediate nodes or the signal output terminal, preventing the GOA's output from experiencing logic confusion. However, the performance of GOA's low-level-holding circuit is easy to deteriorate due to the threshold voltage shift of pulling-down transistors. Traditional designs are to reduce the characteristics shift of the pulling-down transistors, which include: (1) biasing the pulling-down transistors to the high frequency pulse stress model; (2) biasing the pulling-down transistors to the low frequency pulse stress model; and (3) biasing the pulling-down transistor to the low-voltage direct current model. Test results show that, compared with the high-voltage direct current biasing model, all these three ways can reduce the pulling-down transistors' threshold voltage shift to certain extent. However, the pulling-down transistors' threshold voltage shift is still unavoidable. As a result, GOA's lifetime is still short. It is urgent to develop a new GOA circuit structure to further prolong GOA's lifetime, so as to meet the requirement of high-performance TV panels.

SUMMARY

The present application provides a gate driver circuit, a unit thereof, and a display device, to compensate a low-level-holding module's threshold voltage and prolong the circuit's working life.

According to a first aspect, an embodiment provides a gate driver circuit comprising at least one cascaded gate driver circuit unit. The gate driver circuit unit comprises: a drive module for transmitting a first clock signal to the signal output terminal of the gate driver circuit unit by switching the off and on states of the control of the drive module, so as to output a scanning signal; an input module for controlling the control of the drive module to switch the off and on states; a low-level-holding module for, when its holding enable terminal P obtains an effective voltage level, holding the signal output terminal of the gate driver circuit and/or the control of the drive module at a low voltage level. The gate driver circuit further comprises at least one adaptive voltage generating module. The signal output terminal of the adaptive voltage generating module is connected to the holding enable. The adaptive voltage generating module is used to generate a self-compensating voltage according to its constant current source and transmit the self-compensating voltage to the holding enable through its signal output, to provide the effective voltage level to the holding enable.

According to a second aspect, another embodiment provides a display device comprising a two dimensional pixel array consisting of a plurality of pixels, and a plurality of data lines in a first direction and a plurality of gate scanning lines in a second direction connected to each pixel of the array; a data driver circuit for providing a data signal to the data line; and the aforementioned gate driver circuit for providing a gate drive signal to the gate scanning line.

According to the gate driver circuit provided in the above embodiments, the threshold voltage shift of a pulling-down transistor in a low-level-holding module will embody in the holding enable. Because the signal output terminal of the adaptive voltage generating module is connected to the holding enable of the low-level-holding module, when the threshold voltage shift happens to a pulling down transistor, the adaptive voltage generating module generates a self-compensating voltage through its constant current source, so as to compensate the increase of the threshold voltage. As such, the overdrive voltage of the pulling-down transistor keeps constant and has a good pulling-down performance, and consequently the lifetime of the gate driver circuit is prolonged.

DETAILED DESCRIPTION

The present application is explained in detail below according to the embodiments in connection with the appended drawings.

The terminologies used herein are first explained.

The switches in the present application are transistors.

A transistor in this application may be a bipolar transistor or a field effect transistor. When the transistor is a bipolar transistor, the control electrode is the base of the bipolar transistor, the first electrode is the collector or the emitter of the bipolar transistor, and correspondingly, the second electrode is the emitter or the collector of the bipolar transistor. When the transistor is a field effect transistor, the control electrode is the gate of the field effect transistor, the first electrode is the drain or the source of the field effect transistor, and correspondingly, the second electrode is the source or the drain of the field effect transistor. The transistors in display usually are one type of field effect transistor: thin film transistors. The present application is described below in detail by taking the field effect transistor as the example of a transistor. In other embodiments, the transistor can be a bipolar transistor.

The effective voltage level is a voltage level that can turn on a transistor. For example, if a transistor is an N type transistor, the corresponding effective voltage level is high voltage level. The application is described by taking the effective voltage level being a high voltage level as example unless otherwise stated.

Embodiment I

Figure 1:
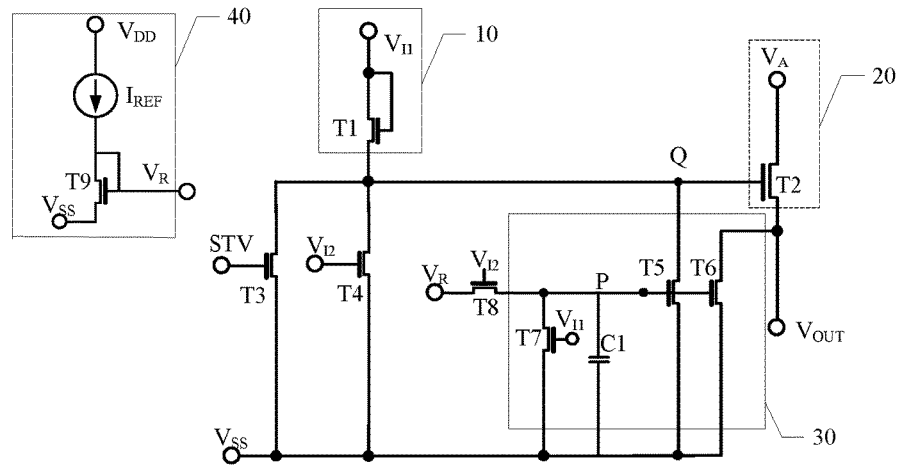
FIG. 1 illustrates a circuit structure diagram of a gate driver circuit unit disclosed in Embodiment I.

FIG. 1 illustrates a circuit structure diagram of a gate driver circuit unit disclosed in this embodiment. The gate driver circuit unit comprises a driving module 20, an input module 10, a low-level-holding module 30, and an adaptive voltage generating module 40.

The driving module 20 is used to transmit a first clock signal $V_A$ to the signal output terminal of the gate driver circuit unit by switching off and on under the control of the control terminal Q of the drive module 20, so as to output a scanning signal $V_{OUT}$. In an embodiment, the off and on states of the control terminal Q may be represented by high and low voltage levels. For example, when at high voltage level, the control terminal Q is in on-state; when at low voltage level, the control terminal Q is in off-state. In another embodiment, the off and on states can be complementary according to the transistor type. In a specific embodiment, the driving module 20 may comprise a second transistor T2. The first electrode of the second transistor T2 is used to input the first clock signal $V_A$. The control electrode of the second transistor T2 is coupled to the control terminal Q of the driving module 20. The second electrode of the second transistor T2 is coupled to the signal output terminal of the gate driver circuit unit. In other embodiments, other existing or future driving ways may also apply.

The input module 10 is configured to control the control terminal Q of the driving module 20 to switch the on and off states. In a specific embodiment, the input module 10 may comprise a first transistor T1. The control electrode of the first transistor T1 is connected to its first electrode to input a first input signal $V_{I1}$. The second electrode of the first transistor T1 is connected to the control terminal Q of the driving module 20. In other embodiments, other existing or future input ways may also apply. In this embodiment, the effective voltage level of the first input signal $V_{I1}$ arrives before the arrival of the effective voltage level of the first clock signal $V_A$. For example, the period of the first clock signal $V_A$ may be T and the duty ratio is 50%. The pulse width of the first input signal $V_{I1}$ may be T/2. Then the arrival of the effective voltage level of the first input signal $V_{I1}$ precedes the arrival of the effective voltage level of the first clock signal $V_A$ by T/2. It should be noted that, when the transistor is an N type transistor, the turn-on effective voltage level of the control electrode is high voltage level. On the contrary, when the transistor is a P type transistor, the turn-on effective voltage level of the control electrode is low voltage level. This embodiment is illustrated by taking an N type transistor as an example. Correspondingly, the turn-on effective voltage level of a transistor is high voltage level.

The low-level-holding module 30 may be configured to, when its holding enable terminal P is at effective voltage level, hold the signal output terminal of the gate driver circuit and/or the control terminal Q of the driving module 20 at low voltage level. In a specific embodiment, the low-level-holding module 30 may comprise a fifth transistor T5 and a sixth transistor T6. The control electrode of the fifth transistor T5 is connected to the control electrode of the sixth transistor T6, and their connection node is the holding enable terminal P of the low-level-holding module 30. The first electrode of the fifth transistor T5 is connected to the control terminal Q of the driving module 20. The second electrode of the fifth transistor T5 is connected to low voltage level end $V_{SS}$. The first electrode of the sixth transistor T6 is connected to the signal output terminal of the gate driver circuit unit, and the second electrode of the sixth transistor T6 is connected to the low voltage level end $V_{SS}$. In a preferred embodiment, the low-level-holding module 30 may also comprise a first capacitor C1. The first capacitor C1 is connected between the holding enable terminal P and the low voltage level end $V_{SS}$. The main function of the first capacitor C1 is to hold the voltage of the holding enable terminal P during the low-level-holding stage. In other embodiments, other existing or future holding ways may also apply.

It should be noted that, the forgoing modules are merely examples to explain the gate driver circuit unit in principle. Each module can adopt an existing technical solution. Therefore, some details are not described elaborately. In light of the existing technical solution, those skilled in the art can implement the connections among modules of the gate driver circuit unit. In addition, in order to optimize the function of each module, those skilled in the art can add devices or modules appropriately according to practical requirements.

For example, in order to initialize the voltage of the control terminal Q in the driving module 20, in one embodiment, the gate driver circuit unit may also comprise a third transistor T3. The control electrode of the third transistor T3 is configured to input an initialization signal $V_{STV}$. The first electrode of the third transistor is connected to the terminal Q of the driving module 20. The second electrode of the third transistor T3 is connected to the low voltage level end $V_{SS}$. In the initialization stage, the third transistor T3 is turned on in response to the effective voltage level of the initialization signal $V_{STV}$, so as to initialize the voltage of the control terminal Q. In a specific embodiment, the effective voltage level of the initialization signal $V_{STV}$ may be, for example, a high pulse signal with a T/2 pulse width. The end of effective voltage level of the initialization signal $V_{STV}$ precedes the arrival of the effective voltage level of the first input signal $V_{I1}$ by T/4 (Of course, it also can be set according to practical requirements).

For another example, in order to pull down the voltage of the control terminal Q in the driving module 20 after the gate driver circuit unit outputs the scanning signal $V_{OUT}$, the gate driver circuit unit may also comprise a fourth transistor T4. The control electrode of the fourth transistor T4 is configured to input a second input signal $V_{I2}$. The first electrode of the fourth transistor T4 is connected to the control terminal Q of the driving module 20. The second electrode of the fourth transistor T4 is connected to the low voltage level end $V_{SS}$. After the gate driver circuit unit outputs the scanning signal $V_{OUT}$, the fourth transistor T4 is turned on in response to the second input signal $V_{f2}$, so as to discharge the control terminal Q.

For yet another example, in order to charge the control terminal Q in a better way when the input module 10 responds to the first input signal $V_{f1}$, preventing the voltage of the control terminal Q being pulled down by the low-level-holding module 30 unexpectedly, the low-level-holding module 30 may also comprise a seventh transistor T7. The control electrode of the seventh transistor T7 is configured to input the first input signal $V_{f1}$. The first electrode of the seventh transistor T7 is connected to the holding enable terminal P. The second electrode of the seventh transistor T7 is connected to the low voltage level end $V_{SS}$. As such, when the input module 10 responds to the effective voltage level of the first input signal $V_{f1}$ to charge the control terminal Q, the seventh transistor T7 is turned on in response to the effective voltage level of the first input signal $V_{f1}$, pulling down the voltage of the holding enable terminal P to low voltage level.

In this embodiment, the arrival time of the effective voltage level of the second input signal $V_{f2}$ lags behind the end time of the effective voltage level of the first clock signal $V_A$. For example, if the pulse width of the second input signal $V_{f2}$ is T/2, the arrival time of the effective voltage level of the second input signal $V_{f2}$ may lag behind the end time of the effective voltage level of the first clock signal $V_A$ by T/2.

The gate driver circuit unit disclosed in this embodiment may also comprise an adaptive voltage generating module 40. The signal output terminal of the adaptive voltage generating module 40 is connected to the holding enable terminal P. The adaptive voltage generating module 40 is configured to generate a self-compensating voltage $V_R$ according to its constant current source, and to transmit the self-compensating voltage $V_R$ to the holding enable terminal P through its signal output terminal, to provide an effective voltage level to the holding enable terminal P.

In a preferred embodiment, an eighth transistor T8 is connected between the adaptive voltage generating module 40 and the low-level-holding module 30. The first electrode of the eighth transistor T8 is connected to the signal output terminal of the adaptive voltage generating module 40. The second electrode of the eighth transistor T8 is connected to the holding enable terminal P of the low-level-holding module 30. The control electrode of the eighth transistor T8 is configured to input a second input signal $V_{f2}$. The eighth transistor T8 responds to the effective voltage level of the second input signal $V_{f2}$ to connect the first electrode and the second electrode of the eighth transistor T8, so that the self-compensating voltage $V_R$ generated by the adaptive voltage generating module 40 is transmitted to the holding enable terminal P through its signal output terminal.

In a specific embodiment, the adaptive voltage generating module 40 comprises a constant current source and a ninth transistor T9. The first electrode of the ninth transistor T9 is connected to the control electrode of the ninth transistor T9. The control electrode of the ninth transistor T9 act as the signal output terminal of the adaptive voltage generating module 40. The second electrode of the ninth transistor T9 is connected to the low voltage level end $V_{SS}$. The constant current source is configured to generate constant current $I_{REF}$. The first end of the constant current source is configured to input a preset voltage. The second end of the constant current source is connected to the first electrode of the ninth transistor T9. In a specific embodiment, the constant current source is a current source, and preferably is a current source with controllable current level. In a specific embodiment, the preset voltage may be provided by the high voltage level end.

It should be noted that, when a plurality of gate driver circuit units are cascaded in the gate driver circuit, the adaptive voltage generating module 40 can be shared by the plurality of gate driver circuit units or each gate driver circuit unit may be separately configured with an adaptive voltage generating module 40.

Figure 2:
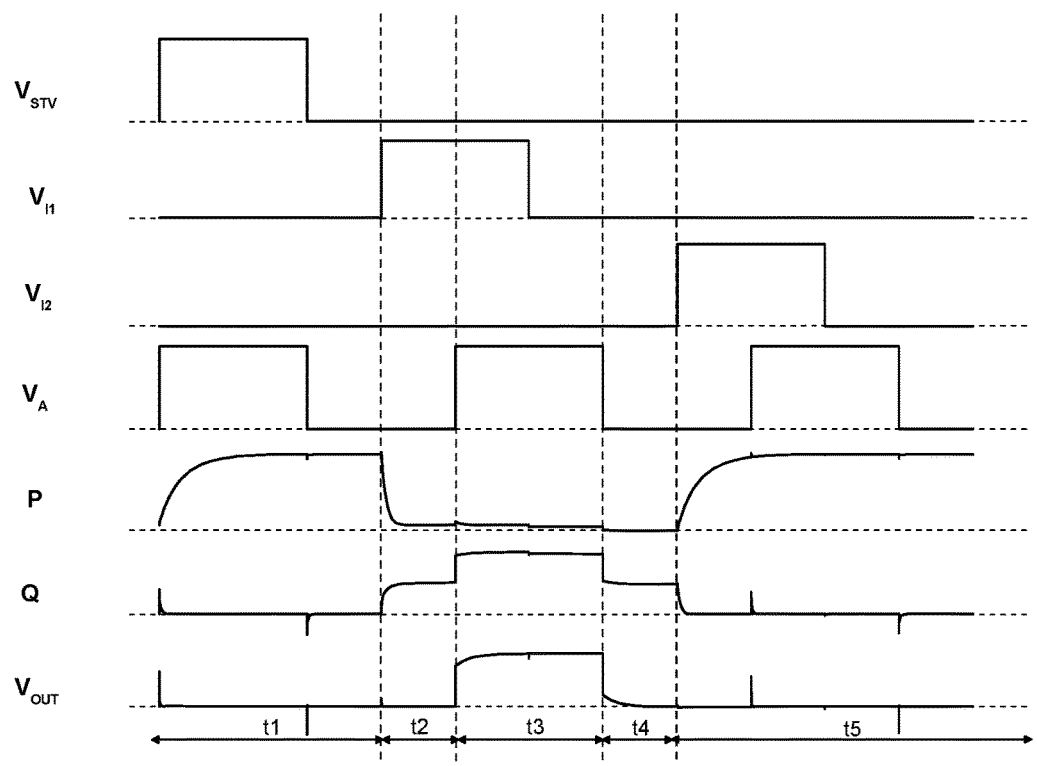
FIG. 2 illustrates a working time sequence of a gate driver circuit unit according to one embodiment.

FIG. 2 illustrates a working time sequence of a gate driver circuit unit according to this embodiment. For the convenience of following description, $V_H$ is used to represent the high voltage level (high potential) of each clock signal or pulse signal, and $V_L$ is used to represent the low voltage level (low potential) of each clock signal or pulse signal. In this embodiment, the work process of the gate driver circuit unit includes five stages, i.e., initialization stage, pre-charge stage, pulling-up stage, pulling-down stage, and low-level-holding stage. The work process of the gate driver circuit unit in this embodiment is detailed in connection with FIG. 1 and FIG. 2.

In the initialization stage (t1), the initialization signal $V_{STV}$ is at the high voltage level. The third transistor T3 is turned on. The control terminal Q of the driving module 20 is pulled down by the turned-on third transistor T3 to the low voltage level $V_L$. As a result, the initialization of the control terminal Q is completed.

In the pre-charge stage (t2), the first input signal $V_{f1}$ is at the high voltage level, and the first clock signal $V_A$ is at the low voltage level. The first transistor T1 is turned on in response to high voltage level of the first input signal $V_{f1}$. The first input signal $V_{f1}$ charges the control terminal Q of the driving module 20 through the turned-on first transistor T1, and therefore the voltage of the control terminal Q is increased. When the voltage of the control terminal Q is higher than the threshold voltage of the second transistor T2, the second transistor T2 is turned on. At this time, because the first clock signal $V_A$ is at the low voltage level, the scanning signal $V_{OUT}$ output by the signal output terminal of the gate driver circuit unit is at the low voltage level. The seventh first transistor T7 is turned on in response to the high voltage level of the first input signal $V_{f1}$, and the holding enable terminal P is pulled down by the turned-on seventh transistor T7 to the low voltage level. As a result, the fifth transistor T5 and the sixth transistor T6 are turned off. At the end of the pre-charge stage, the voltage of the control terminal Q reaches $V_H$–$V_T$, wherein $V_T$ is the threshold voltage of the second transistor T2, and the pre-charge is completed.

In the pulling-up stage t3, the first clock signal $V_A$ is changed to the high voltage level, and the initialization signal $V_{STV}$ and the second input signal $V_{f2}$ are at the low voltage level. Because the voltage of the control terminal Q is $V_H$–$V_T$, so the second transistor T2 is turned on. The first clock signal $V_A$ provides charge current to load through the turned-on second transistor T2. The scanning signal $V_{OUT}$ output by the signal output terminal of the gate driver circuit unit rises gradually to $V_H$. In this stage, the first transistor T1 is in connected in diode state. Because the initialization signal $V_{STV}$ and the second input signal $V_{f2}$ are at the low voltage level, the third transistor T3 and the fourth transistor T4 are kept at off state. Because the holding enable terminal P is at the low voltage level, the fifth transistor T5 and the sixth transistor T6 are also kept at off state. As such, the control terminal Q is in floating state. The control terminal Q is coupled to the high voltage level $2V_H-V_T$ by the first clock signal $V_A$ due to the bootstrap effect.

In the pulling-down stage (t4), the first clock signal $V_A$ is changed to the low voltage level and the second transistor T2 is kept at on state. As a result, the scanning signal $V_{OUT}$ output by the signal output terminal of the gate driver circuit falls to the low voltage level. The voltage at the control terminal Q falls to $V_H-V_T$.

In the low-level-holding stage (T5), the second input signal $V_{I2}$ is at the high voltage level and the fourth transistor T4 and the eighth transistor T8 are turned on in response to the high voltage level of the second input signal $V_{I2}$. As a result, the control terminal Q is pulled down to the low voltage level by the turned-on fourth transistor T4. The self-compensating voltage $V_R$ is transmitted to the holding enable terminal P through the turned-on eighth transistor T8. The voltage of the holding enable terminal P rises, and when the voltage of the holding enable terminal P exceeds the threshold voltages of the fifth transistor T5 and the sixth transistor T6, the fifth transistor T5 and the sixth transistor T6 are turned on in response to the voltage of the holding enable terminal P. Thus, the voltages of the control terminal Q of the driving module 20 and the signal output terminal of the gate driver circuit unit are pulled down to the low voltage level, so that the charges at the control terminal Q and the signal output terminal of the gate driver circuit unit accumulated due to clock signals or noise signals can be discharged through the pulling-down transistors (i.e., the fifth transistor T5 and the sixth transistor T6).

The threshold voltage of transistors in the gate driver circuit will shift under long time of gate voltage stress, and the circuit lifetime is influenced. Influence from direct voltage stress is particularly obvious. In this embodiment, except for the fifth transistor T5, the sixth transistor T6, and the ninth transistor T9 working under direct bias, all other transistors work under the low frequency pulse bias, and therefore their threshold voltage shift is small which has no obvious influence on their working state. Because the voltage applied to the control electrodes (for example, the gate) of the fifth transistor T5, the sixth transistor T6, and the ninth transistor T9 are positive, the threshold voltages of the three transistors will increase. The control electrode voltages of the three transistors are the voltage of the holding enable terminal P, and the second electrode (for example, the source) voltages are the low voltage level $V_L$ from the low voltage level end $V_{SS}$. Therefore, it may be considered that the threshold voltage shift patterns of the three transistors are almost the same. As time goes on, the threshold voltage of the ninth transistor T9 will increase, and the voltage $V_R$ formed on the control electrode of the ninth transistor T9 will also increase, so as to compensate the decline in turn-on capability due to the threshold voltage increase of the fifth transistor T5 and the sixth transistor T6. The adaptive increase in the control electrode voltage of the pulling-down transistor can effectively hold the low voltage level of the control terminal Q and the signal output terminal of the gate driver circuit unit. By adjusting the constant current $I_{REF}$ generated by the constant current source and the sizes of the fifth transistor T5, the sixth transistor T6, and the ninth transistor T9. the voltage of the holding enable terminal P can be a relatively low voltage which is just a little higher than the threshold voltage during the GOA circuit's early work stage, and thereafter, along with the increase in the threshold voltage of the ninth transistor T9, the voltage of the holding enable terminal P is increased adaptively, the ninth transistor T9, the fifth transistor T5 and the sixth transistor T6 having a constant low gate-source voltage difference (i.e., overdrive voltage). Therefore, the threshold voltage shift rate of the three transistors is slow, so that the three transistors can work normally for a long time, so at to prolong the GOA circuit's lifetime.

Embodiment II

The difference between this embodiment and the above embodiment is that: in above embodiment, the first electrode of the third transistor T3 is connected to the control terminal Q of the driving module 20, the second electrode is connected to the low voltage level end $V_{SS}$, and the control terminal Q of the driving module 20 is discharged and initialized directly by the third transistor T3. In this embodiment, the control terminal Q is discharged and initialized by the third transistor T3 providing the effective voltage level to the holding enable terminal P. Furthermore, the fourth transistor T4 may be omitted.

Figure 3:
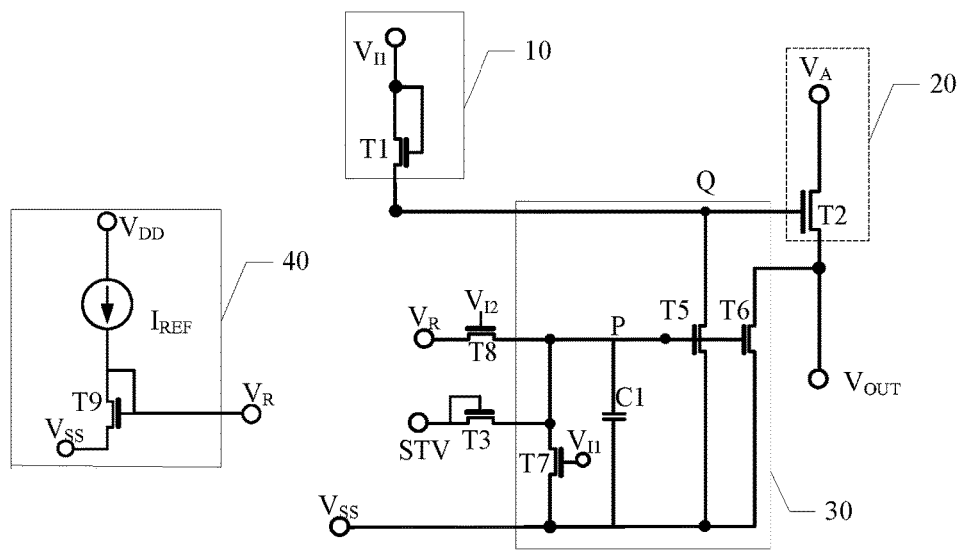
FIG. 3 illustrates a circuit structure diagram of a gate driver circuit unit disclosed in Embodiment II.

FIG. 3 illustrates a circuit structure diagram of a gate driver circuit unit disclosed in this embodiment. The first electrode of the third transistor T3 is connected to the control electrode and is configured to input the initialization signal $V_{STV}$. The second electrode of the third transistor T3 is connected to the holding enable terminal P.

Please refer to FIG. 2. The work time sequence of the gate driver circuit unit in this embodiment is almost the same as that of the above embodiment. The difference is that, in the initialization stage, the initialization signal $V_{STV}$ is at the high voltage level. As such, the third transistor T3 is turned on, and the initialization signal $V_{STV}$ is transmitted to the holding enable terminal P through the turned-on third transistor T3. Consequently, the fifth transistor T5 and the sixth transistor T6 will be turned on in response to the effective voltage level of the holding enable terminal P, so that the control terminal Q of the driving module 20 and the signal output terminal of the gate driver circuit unit are respectively discharged to the low voltage level end $V_{SS}$ through the turned-on fifth transistor T5 and sixth transistor T6. As a result, the potential initialization of the control terminal Q of the driving module 20 and the signal output terminal of the gate driver circuit unit is completed.

In the gate driver circuit unit disclosed in this embodiment, other work stages are almost the same as those in the above embodiment, and hence not repeat here.

Embodiment III

In order to prevent the adaptive voltage generating module 40 outputting the self-compensating voltage $V_R$ to the gate driver circuit unit which may influence the normal work of the gate driver circuit unit during stages other than the low-level-holding stage of the gate driver circuit unit, in practice, appropriate switch transistors can be added to the adaptive voltage generating module 40 to control the work state thereof.

Figure 4A:
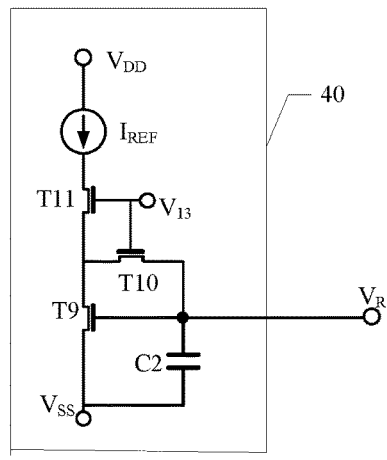
FIG. 4a illustrates a circuit structure diagram of an adaptive voltage generating module disclosed in Embodiment III.
Figure 4B:
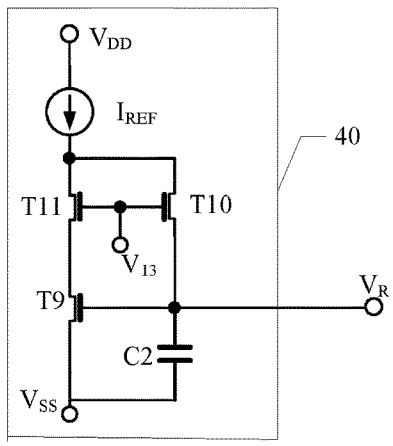
FIG. 4b illustrates a circuit structure diagram of another adaptive voltage generating module disclosed in Embodiment III.

FIG. 4a and FIG. 4b illustrate circuit structure diagrams of the adaptive voltage generating module 40 disclosed in this embodiment. The adaptive voltage generating module 40 disclosed in this embodiment may also comprise a tenth transistor T10 and an eleventh transistor T11 to implement the on-off control of the adaptive voltage generating module 40.

The eleventh transistor T11 is connected between the second end of the constant current source and the first electrode of the ninth transistor T9. Specifically, the first electrode of the eleventh transistor T11 is connected to the second end of the constant current source, and the second electrode of the eleventh transistor T11 is connected to the first electrode of the ninth transistor T9.

In an embodiment, please refer to FIG. 4a, the tenth transistor T10 is connected between the first electrode of the ninth transistor T9 and the control electrode of the ninth transistor T9. Specifically, the first electrode of the tenth transistor T10 is connected to the first electrode of the ninth transistor T9, and the second electrode of the tenth transistor T10 is connected to the control electrode of the ninth transistor T9.

Alternatively, in another embodiment, please refer to FIG. 4b, the tenth transistor T10 is connected between the first electrode of the eleventh transistor T11 and the control electrode of the ninth transistor T9. Specifically, the first electrode of the tenth transistor T10 is connected to the first electrode of the eleventh transistor T11, and the second electrode of the tenth transistor T10 is connected to the control electrode of the ninth transistor T9.

Please refer to FIG. 4a and FIG. 4b. The control electrode of the eleventh transistor T11 is connected to the control electrode of the tenth transistor T10 for inputting a third input signal $V_{I3}$. The eleventh transistor T11 and the tenth transistor T10 are turned on in response to the effective voltage level of the third input signal $V_{I3}$, so as to excite the adaptive voltage generating module 40 to work. In a specific embodiment, because the adaptive voltage generating module 40 usually does not transmit the self-compensating voltage $V_R$ to the gate driver circuit unit until the low-level-holing stage, in a preferred embodiment, the third input signal $V_{I3}$ can also be provided by the second input signal $V_{I2}$.

In a preferred embodiment, the adaptive voltage generating module 40 can also comprise a second capacitor C2. The second capacitor C2 is connected in parallel between the control electrode of the ninth transistor T9 and the second electrode of the ninth transistor T9. The capacitor C2 can, for example, hold the self-compensating voltage $V_R$ generated by the adaptive voltage generating module 40 when the tenth transistor T10 and the eleventh transistor T11 are turned off.

Please refer to FIG. 4a and FIG. 4b. When the third input signal $V_{I3}$ is at the effective voltage level (for example, the high voltage level), the tenth transistor T10 and the eleventh transistor T11 are turned on in response to the effective voltage level of the third input signal $V_{I3}$. The constant current $I_{REF}$ generated by the constant current source flows through the tenth transistor T10, the eleventh transistor T11, and the ninth transistor T9 and forms a self-compensating voltage $V_R$ at the control electrode (for example, the gate) of the ninth transistor T9. The self-compensating voltage $V_R$ can be expressed as:

$$V_R = \sqrt{\frac{2I_{REF}L}{\mu C_{ox}W}} + V_{SS} + V_{TH}$$

wherein, Cox, L, and W are respectively the device mobility, gate capacitor per unit area, channel length and channel width of the ninth transistor T9. $V_{TH}$ is the threshold voltage of the ninth transistor T9. The above expression shows that the self-compensating voltage $V_R$ will increase with the threshold voltage $V_{TH}$ of the ninth transistor T9. As such, the output is guaranteed to be stable during the low-level-holding stage.

When the third input signal $V_{I3}$ is at the low voltage level, the tenth transistor T10 and the eleventh transistor T11 are in the off state, but can continue to hold the self-compensating voltage $V_R$ under the storage function of the second capacitor C2 until the arrival of the next effective voltage level of the third input signal $V_{I3}$.

It should be noted that, in other embodiments, the self-compensating voltage $V_R$ generated by the adaptive voltage generating module 40 can be sent to each gate driver circuit unit by output buffers.

Figure 4C:
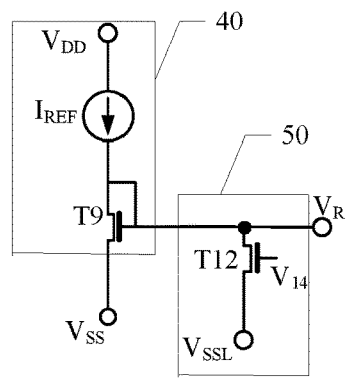
FIG. 4c illustrates a circuit structure diagram of a third adaptive voltage generating module disclosed in Embodiment III.

In order to realize a longer lifetime, in a preferred embodiment, the threshold voltage shift of the fifth transistor T5 and the sixth transistor T6 can be recovered. When a negative voltage is applied to the control electrode (for example, the gate) of a transistor, the threshold voltage shift that has happened will be recovered partly. According to this principle, the gate driver circuit unit disclosed in this embodiment also may comprise a recovery module 50. Please refer to FIG. 4c. The recovery module 50 may comprise a fourteenth transistor T14. The first electrode of the fourteenth transistor T14 is connected to the signal output terminal of the adaptive voltage generating module 40. The second electrode of the fourteenth transistor T14 is configured to input a reverse bias voltage $V_{SSL}$. The reverse bias voltage $V_{SSL}$ is a voltage lower than the low voltage level end $V_{SS}$. The control electrode of the fourteenth transistor T14 is configured to input a fourth input signal $V_{I4}$. The fourteenth transistor T14 is configured to transmit the reverse bias voltage $V_{SSL}$ to the signal output terminal of the adaptive voltage generating module 40, so as to transmit $V_{SSL}$ to the control electrodes of pulling-down transistors (for example, the fifth transistor T5 and the sixth transistor T6) of the low voltage level module, under the excitation of the effective voltage level of the fourth input signal $V_{I4}$. When the panel is in standby mode, the gate driver circuit continues to work, and the fourth input signal $V_{I4}$ is at the effective voltage level (for example, the high voltage level). At this time, the low voltage level $V_{SSL}$ is transmitted to the control electrode of the ninth transistor T9 through the fourteenth transistor T14, and then is transmitted in turn to the control electrodes of the fifth transistor T5 and the sixth transistor T6 as a self-compensating voltage. Certain degree of threshold recovery will happen to the transistors T9, T5, and T6 due to the reverse bias of $V_{SSL}$, so that the transistors' lifetime is prolonged. It should be noted that, when the effective voltage level of the fourth input signal $V_{I4}$ arrives, the constant current source should stop providing current $I_{REF}$ to the ninth transistor T9: in an embodiment, this can be realized by a current source with controllable current level. For example, when the effective voltage level of the fourth input signal $V_{I4}$ arrives, the current $I_{REF}$ generated by the constant current source can be turned off by existing ways; in another embodiment, a switch transistor can be used to implement preventing the current $I_{REF}$ provided by the constant current source from flowing to the ninth transistor T9. For example, this turning off can be implemented by the tenth transistor T10 and the eleventh transistor T11 illustrated in FIG. 4a and FIG. 4b.

Figure 5:
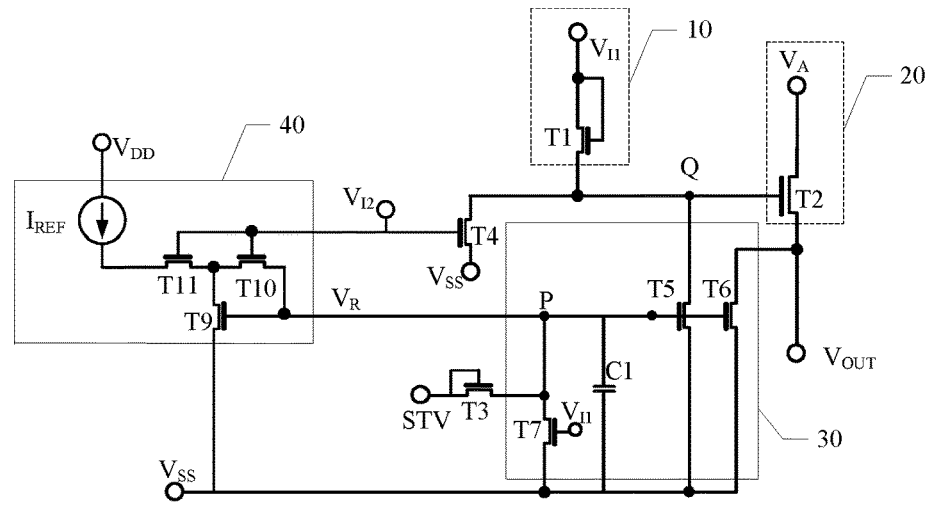
FIG. 5 illustrates a circuit structure diagram of a gate driver circuit unit disclosed in Embodiment III.

The adaptive voltage generating module 40 illustrated in FIG. 4a is taken as an example. Please refer to FIG. 5, which is a circuit structure diagram of a gate driver circuit unit disclosed in this embodiment. The connections among the input module 10, the low-level-holding module 30, the driving module 20, the third transistor T3, and the fourth transistor T4 can be referred to Embodiment II. Compared with the above embodiment, the difference lies in, in this embodiment, the gate driver circuit unit adopts the adaptive voltage generating module 40 illustrated in FIG. 4a and the control electrode of the ninth transistor T9 and the control electrode of the tenth transistor T10 are configured to receive the second input signal $V_{r2}$.

The working time sequence of the gate driver circuit unit in this embodiment is illustrated in FIG. 2, and its work process is almost the same as that of the above embodiment, including five stages, i.e., initialization stage, pre-charge stage, pulling-up stage, pulling-down stage, and low-level-holding stage. The difference is that, in the low-level-holding stage, the second input signal $V_{r2}$ is at the high voltage level, the fourth transistor T4 is turned on, and the voltage of the control terminal Q is pulled down to the low voltage level. The eleventh transistor T11 and the tenth transistor T10 are turned on in response to the high voltage level of the second input signal $V_{r2}$. The current $I_{REF}$ provided by the constant current source charges the enable holding terminal P through the turned-on tenth transistor T10 and eleventh transistor T11. The final voltage (i.e., the self-compensating voltage $V_R$) of the enable holding terminal P has the following relation with the threshold voltage of the ninth transistor T9:

$$V_R = \sqrt{\frac{2I_{REF}L}{\mu C_{ox}W}} + V_{SS} + V_{TH}$$

The voltage of the enable holding terminal P turns on the fifth transistor T5 and the sixth transistor T6. The control terminal Q and the signal output terminal of the gate driver circuit unit are pulled down to the low voltage level by the turned-on fifth transistor T5 and sixth transistor T6. As such, charges accumulated at the control terminal Q and at the signal output terminal of the gate driver circuit unit are discharged.

A gate driver circuit can be formed by cascading a plurality of gate driver circuit units disclosed in above embodiments, and the cascading can be implemented in existing ways.

Embodiment IV

Figure 6:
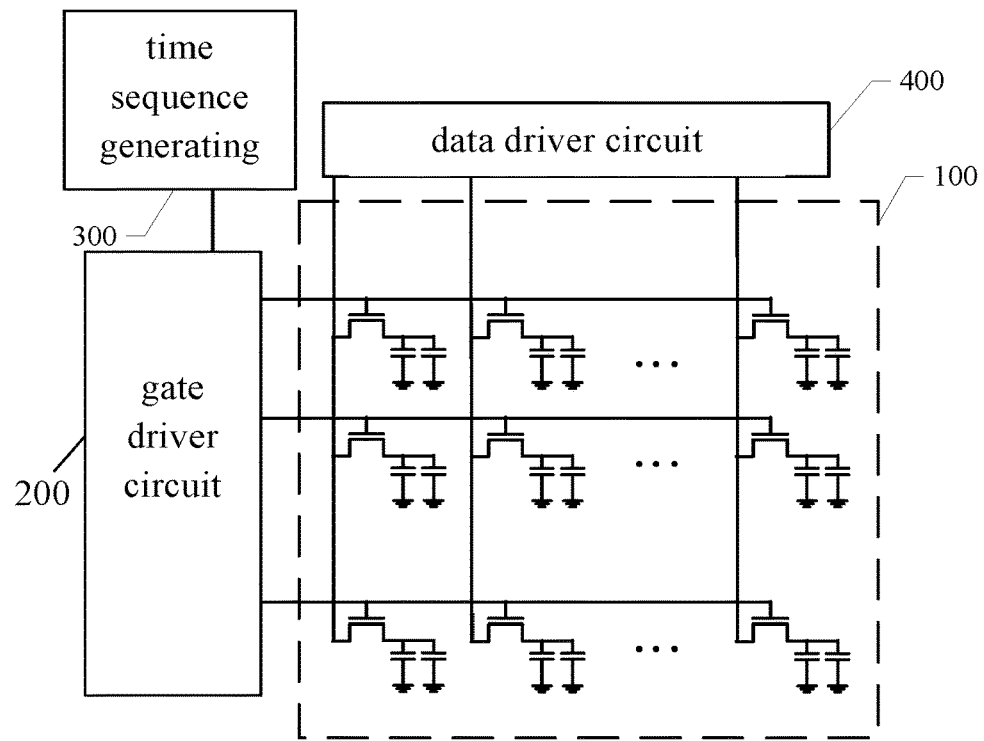
FIG. 6 illustrates a schematic diagram of a display device disclosed in Embodiment W.

This embodiment discloses a display device. As illustrated in FIG. 6, the display device comprises:

a display panel 100, which comprises a two dimensional pixel array including a plurality of two dimensional pixels, and a plurality of gate scanning lines in a first direction (for example, the transverse direction) and a plurality of data lines in a second direction (for example, the longitudinal direction). In the pixel array, pixels in the same row are connected to a same gate scanning line and pixels in the same column are connected to a same data line. The display panel 100 can be a liquid crystal display panel, an organic light emitting display panel, and an electronic paper display panel etc., and the corresponding display device can be a liquid crystal display, an organic light emitting display, and an electronic paper display etc.;

a gate drive circuit 200, which is formed by adopting the gate driver circuit units provided by above embodiments. In the gate driver circuit 200, the signal output terminals of a gate driver circuit unit are coupled to the corresponding gate scanning lines of the display panel 100, for scanning the pixel array line by line. The gate driver circuit 200 may be connected to the display panel 100 by welding or may be integrated in the display panel 100. In a specific embodiment, the gate driver circuit 200 can be placed on one side of the display panel 100. In a preferred embodiment, a gate driver circuit is placed on each side of the display panel 100;

a data driver circuit 400, which is configured to generate an image data signals, and to transmit it to the display panel 100 and the corresponding data lines, and to transmit to the corresponding pixel units through the data lines to realize the image gray scale;

a time sequence generating circuit 300, which is configured to generate all kinds of control signals needed by the gate driver circuit 200.

Specific embodiments are used to illustrate the present application. These embodiments are merely used to help to understand the present application and are not to be constructed as limiting the present application. Those skilled in the art can make various simple deductions, variations or replacements to the above specific embodiments according to the application concept.

What is claimed is:

1. A gate driver circuit comprising at least one cascaded gate driver circuit unit, the gate driver circuit unit comprising:

a driving module, configured to transmit a first clock signal to a signal output terminal of the gate driver circuit unit by switching off and on states of the driving module via a control terminal, so as to output a scanning signal;

an input module, configured to control the control terminal of the driving module to switch the off and on states;

a low-level-holding module, configured to when its holding enable terminal obtains an effective voltage level, hold the signal output terminal of the gate driver circuit and/or the control terminal of the driving module at a low voltage level;

wherein, the gate driver circuit further comprises at least one adaptive voltage generating module, a signal output terminal of the adaptive voltage generating module is connected to the holding enable terminal, the adaptive voltage generating module is configured to generate a self-compensating voltage according to its constant current source, and to transmit the self-compensating voltage to the holding enable terminal through its signal output terminal, to provide an effective voltage level to the holding enable terminal.

2. The gate driver circuit of claim 1, wherein the input module comprises a first transistor, a control electrode of the first transistor is connected to its first electrode to input a first input signal; a second electrode of the first transistor is connected to the control terminal of the driving module;

the driving module comprises a second transistor, a first electrode of the second transistor is configured to input the first clock signal, a control electrode of the second transistor acts as the control terminal of the driving module, and a second electrode of the second transistor acts as the signal output terminal of the gate driver circuit unit;

the effective voltage level of the first input signal precedes that of the first clock signal.

3. The gate driver circuit of claim 2, wherein an eighth transistor is connected between the adaptive voltage generating module and the low-level-holding module;

a first electrode of the eighth transistor is connected to the signal output terminal of the adaptive voltage generating module, a second electrode of the eighth transistor is connect to the holding enable terminal of the lowlevel-holding module, a control electrode of the eighth transistor is used to input a second input signal;

the eighth transistor in responds to an effective voltage level of the second input signal to couple the first electrode and the second electrode of the eighth transistor;

the effective voltage level of the second input signal lags behind the effective voltage level of the first clock signal.

4. The gate driver circuit of claim 1, wherein the low-level-holding module comprises a fifth transistor and a sixth transistor;

a control electrode of the fifth transistor is connected to a control electrode of the sixth transistor via a connection node which is the holding enable terminal of the low-level-holding module; a first electrode of the fifth transistor is connected to the control terminal of the driving module; a second electrode of the fifth transistor is connected to the low voltage level end;

a first electrode of the sixth transistor is connected to the signal output terminal of the gate driver circuit unit, a second electrode of the sixth transistor is connected to the low voltage level end.

5. The gate driver circuit according to claim 1, wherein the adaptive voltage generating module comprises a constant current source and a ninth transistor;

a first electrode of the ninth transistor is connected to a control electrode of the ninth transistor, the control electrode of the ninth transistor acts as the signal output terminal of the adaptive voltage generating module, a second electrode of the ninth transistor is connected to the low voltage level end;

a first end of the constant current source is used to input a preset potential, and a second end of the constant current source is connected to the first electrode of the ninth transistor.

6. The gate driver circuit of claim 5, wherein the constant current source is a current source with controllable current level.

7. The gate driver circuit of claim 6, further comprises a recovery module, which comprises a fourteenth transistor, a first electrode of the fourteenth transistor is connected to the signal output terminal of the adaptive voltage generating module, a second electrode of the fourteenth transistor is used to input a reverse bias voltage, a control electrode of the fourteenth transistor is used to input a fourth input signal; the fourteenth transistor is turned on in response to an effective voltage level of the fourth input signal, providing the reverse bias voltage to the signal output terminal of the adaptive voltage generating module.

8. The gate driver circuit of claim 5, wherein the adaptive voltage generating module further comprises a tenth transistor and an eleventh transistor;

the eleventh transistor is connected between the second end of the constant current source and the first electrode of the ninth transistor; a first electrode of the eleventh transistor is connected to the second end of the constant current source, a second electrode of the eleventh transistor is connected to the first electrode of the ninth transistor;

the tenth transistor is connected between the first electrode of the ninth transistor and the control electrode of the ninth transistor; a first electrode of the tenth transistor is connected to the first electrode of the ninth transistor, a second electrode of the tenth transistor is connected to the control electrode of the ninth transistor;

a control electrode of the eleventh transistor is connected to a control electrode of the tenth transistor for inputting a third input signal the eleventh transistor and the tenth transistor are turned on in response to an effective voltage level of the third input signal so as to stimulate the adaptive voltage generating module to work.

9. The gate driver circuit of claim 5, wherein the adaptive voltage generating module further comprises a second capacitor; the second capacitor is connected between the control electrode of the ninth transistor and the second electrode of the ninth transistor.

10. A display device, comprising a two dimensional pixel array including a plurality of pixels, and a plurality of data lines in a first direction and a plurality of gate scanning lines in a second direction, which are connected to each pixel of the array;

a data driver circuit, configured to provide data signals to the data lines;

wherein the display device further comprises a gate driver circuit according to claim 1, configured to provide gate driving signals to the gate scanning lines.

* * * * *